(12) United States Patent
Ha et al.

(10) Patent No.: US 7,161,860 B2
(45) Date of Patent: Jan. 9, 2007

(54) LOCAL INPUT/OUTPUT LINE PRECHARGE CIRCUIT OF SEMICONDUCTOR MEMORY DEVICE

(75) Inventors: Sung Joo Ha, Seoul (KR); Ho Youb Cho, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/115,373

(22) Filed: Apr. 27, 2005

(65) Prior Publication Data

US 2006/0104119 A1    May 18, 2006

(30) Foreign Application Priority Data

Nov. 15, 2004   (KR) ...................... 10-2004-0093226

(51) Int. Cl.
    *G11C 7/00*    (2006.01)
(52) U.S. Cl. ............. 365/203; 365/185.25; 365/230.06
(58) Field of Classification Search ........... 365/185.25, 365/203, 230.06
    See application file for complete search history.

(56) References Cited

U.S. PATENT DOCUMENTS 5,463,581 A * 10/1995 Koshikawa ............ 365/189.01
5,974,514 A   10/1999 Andrewartha et al.
6,205,069 B1   3/2001 Kim
6,400,629 B1   6/2002 Barth, Jr. et al.
6,487,132 B1   11/2002 Bae et al.
6,532,184 B1 *  3/2003 Chun ........................ 365/203
6,661,721 B1   12/2003 Lehmann et al.
2001/0030900 A1 * 10/2001 Kawaguchi et al. ........ 365/222
2004/0001360 A1   1/2004 Subramanian et al.

FOREIGN PATENT DOCUMENTS

JP          4-291093         10/1992

* cited by examiner

*Primary Examiner*—Cach Phung
*Assistant Examiner*—Eric J. Wendler
(74) *Attorney, Agent, or Firm*—Heller Ehrman LLP

(57) ABSTRACT

A local input/output line precharge circuit of a semiconductor memory device comprises a precharge control unit, an equalization unit and a data output unit. The precharge control unit outputs a precharge control signal to precharge a pair of local input/output lines in response to a continuous write signal activated when a write operation continues. The equalization unit precharges and equalizing the pair of local input/output lines in response to the precharge control signal. The data output unit outputs data signals of a pair of global input/output lines to the pair of local input/output lines in response to output signal from the equalization unit. In the circuit, a local input/output line precharge operation is not performed at a continuous write mode, thereby reducing current consumption.

10 Claims, 4 Drawing Sheets

LOCAL INPUT/OUTPUT LINE PRECHARGE CIRCUIT OF SEMICONDUCTOR MEMORY DEVICE

BACKGROUND OF THE INVENTION

1. Field of the Invention

The present invention generally relates to a local input/output line precharge circuit of a semiconductor memory device, and more specifically, to a technology of reducing current consumption by omitting a local input/output line precharge operation at a continuous write mode.

2. Description of the Related Art

Generally, a semiconductor memory device performs a precharge operation on a pair of local input/output lines at a read and write modes. That is, the pair of local input/output lines transmit a data signal between a pair of global input/output lines and an internal circuit. Here, the semiconductor memory device precharge the pair of local input/output lines at every read or write command, and then the accurate data signal can be transmitted.

FIG. 1 is a diagram illustrating the local input/output line precharge circuit of a conventional semiconductor memory device.

The conventional local input/output line precharge circuit comprises a precharge control unit 10, an equalization unit 20 and a data output unit 30.

The precharge control unit 10 which comprises inverters IV1 and IV2 drives a precharge signal LIO_RST to output a precharge control signal IOEQ.

The equalization unit 20 equalizes the pair of local input/output lines LIO and LIOb in response to the precharge control signal IOEQ. Here, the equalization unit 20 comprises NMOS transistors NM1~NM3 which are controlled by the precharge control signal IOEQ. The NMOS transistors NM1 and NM2 have drains to receive a precharge voltage VBLP, and sources connected to the pair of local input/output lines LIO and LIOb, respectively. The NMOS transistor NM3, which has a drain and a source connected to the sources of the NMOS transistors NM1 and NM2, equalizes the pair of local input/output lines LIO and LIOb.

The data output unit 30 outputs data signals of the pair of global input/output lines GIO and GIOb to the pair of local input/output lines LIO and LIOb in the write mode. Here, the data output unit 30 comprises a write driver control unit 31, a global input/output line bar output unit 32, a global input/output line output unit 33, a pull-up driver 34, a pull-down driver 35, latch units 36 and 37, a local input/output line driving unit 38, and a local input/output line bar driving unit 39.

The write driver control unit 31 comprises a NAND gate ND1 and an inerter IV3.

The NAND gate ND1 performs a NAND operation on a write driver enable signal BWEN and a write driver stop signal BAYBD. The inverter IV3 inverts an output signal from the NAND gate ND1.

The global input/output line bar output unit 32 outputs a data signal of the global input/output line GIO in response to a data masking bar signal WDMb and an output signal BWEN1 from the NAND gate ND1. Here, the global input/output line bar output unit 32 comprises a global input/output line bar driving unit 41 and a latch unit 42.

The global input/output line bar driving unit 41 comprises PMOS transistors PM1 and PM2 that have drains to receive a power voltage VDD level in response to the data masking bar signal WDMb and a global input/output line bar signal GIOb respectively, and NMOS transistors NM4~NM6 that are controlled by the global input/output line bar signal GIOb, the data masking bar signal WDMb and an output signal BWEN1 from the NAND gate ND1 respectively. The PMOS transistor PM1 and the NMOS transistors NM4~NM6 are connected serially between a power voltage terminal and a ground voltage terminal. The PMOS transistor PM2 is connected between the power voltage terminal and the drain of the PMOS transistor PM1.

The latch unit 42, which comprises inverter IV4 and IV5 whose output terminals are connected to their input terminals, maintains an output terminal of the global input/output line bar driving unit 41 at a predetermined level.

The global input/output line output unit 33 outputs the data signal BWEN1 of the global input/output line GIO in response to the data masking bar signal WDMb and the output signal from the NAND gate ND1. Here, the global input/output line output unit 33 comprises PMOS transistors PM3 and PM4 that have drains to receive the power voltage VDD level in response to the data masking bar signal WDMb and the global input/output line signal GIO respectively, and NMOS transistors NM7~NM9 that are controlled by the global input/output line signal GIO, the data masking bar signal WDMb and the output signal BWEN1 from the NAND gate ND1 respectively. The PMOS transistor PM3 and the NMOS transistors NM7~NM9 are connected serially between the power voltage terminal and the ground voltage terminal, and the PMOS transistor PM4 is connected between the power voltage terminal and the drain of the PMOS transistor PM3.

The latch unit 44, which comprises inverters IV6 and IV7 whose output terminals are connected to their input terminals, maintains an output terminal of the global input/output line driving unit 43 at a predetermined level.

The pull-up driver 34 comprises a PMOS transistor PM5, NMOS transistors NM10 and NM11 which are connected serially between the power voltage VDD terminal and the ground voltage terminal. Here, the PMOS transistor PM5 applies a power voltage level to a node N1 in response to an output signal from the inverter IV1, and the NMOS transistors NM10 and NM11 are connected serially between the node N1 and the ground voltage terminal. The NMOS transistor NM10 is controlled by an output signal BWEN2 from the inverter IV3, and the NMOS transistor NM11 is controlled by an output signal from the global input/output line bar output unit 32, thereby applying a ground voltage level signal to the node N1.

The pull-down driver 35 comprises a PMOS transistor PM6 and NMOS transistors NM12 and NM13 which are connected serially between the power voltage VDD terminal and the ground voltage terminal.

The PMOS transistor PM6 applies the power voltage level to a node N2 in response to the output signal from the inverter IV1, and the NMOS transistors NM12 and NM13 are connected serially between the node N2 and the ground voltage terminal. The NMOS transistor NM12 is controlled by the output signal BWEN2 from the inverter IV3, and the NMOS transistor NM13 is controlled by an output signal from the global input/output line output unit 33, thereby applying the ground voltage level signal to the node N2.

The latch unit 36 which comprises inverters IV8 and IV9 maintains a potential of the node N1 at a predetermined level, and the latch unit 37 which comprises inverters IV10 and IV11 maintains a potential of the node N2 at a predetermined level.

The local input/output line driving unit 38 comprises an inverter IV12, a PMOS transistor PM7 and a NMOS transistor NM14. Here, the inverter IV12 inverts an output signal from the latch unit 37, the PMOS transistor PM7 applies a core voltage VCORE level to a node N3 in response to an output signal from the inverter IV12, and the NMOS transistor N14 applies the ground voltage level to the node N3 in response to an output signal from the latch unit 36.

The local input/output line bar driving unit 39 comprises an inverter IV13, a PMOS transistor PM8 and a NMOS transistor NM15. Here, the inverter IV13 inverts an output signal from the latch unit 36, the PMOS transistor PM8 applies the core voltage VCORE level to a node N4 in response to an output signal from the inverter IV13, and the NMOS transistor NM15 applies the ground voltage level to the node N4 in response to an output signal from the latch unit 37. The above-described conventional local input/output lines precharge circuit precharges a pair of local input/output lines at a predetermined level in the write and read modes, and then operates a write driver or input/output sense amplifier to transmit the data signal However, although the write driver changes the levels of the pair of local input/output lines even when the pair of local input/output lines are not precharged, as shown in FIG. 2, the write driver precharges the pair of local input/output lines at a continuous write mode, and loads data to precharge the pair of local input/output lines, repeatedly. As a result, the conventional circuit performs an unnecessary precharge operation at the continuous write mode, which results in increase of current consumption.

SUMMARY OF THE INVENTION

Accordingly, it is an object of the present invention to provide a local input/output line precharge circuit which does not perform an unnecessary precharge operation at a write mode of a semiconductor memory device, thereby preventing unnecessary current consumption.

In an embodiment, a local input/output line precharge circuit of a semiconductor memory device comprises a precharge control unit, an equalization unit and a data output unit. The precharge control unit outputs a precharge control signal to precharge a pair of local input/output lines in response to a continuous write signal activated when a write operation continues. The equalization unit precharges and equalizing the pair of local input/output lines in response to the precharge control signal. The data output unit outputs data signals of a pair of global input/output lines to the pair of local input/output lines in response to output signal from the equalization unit.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
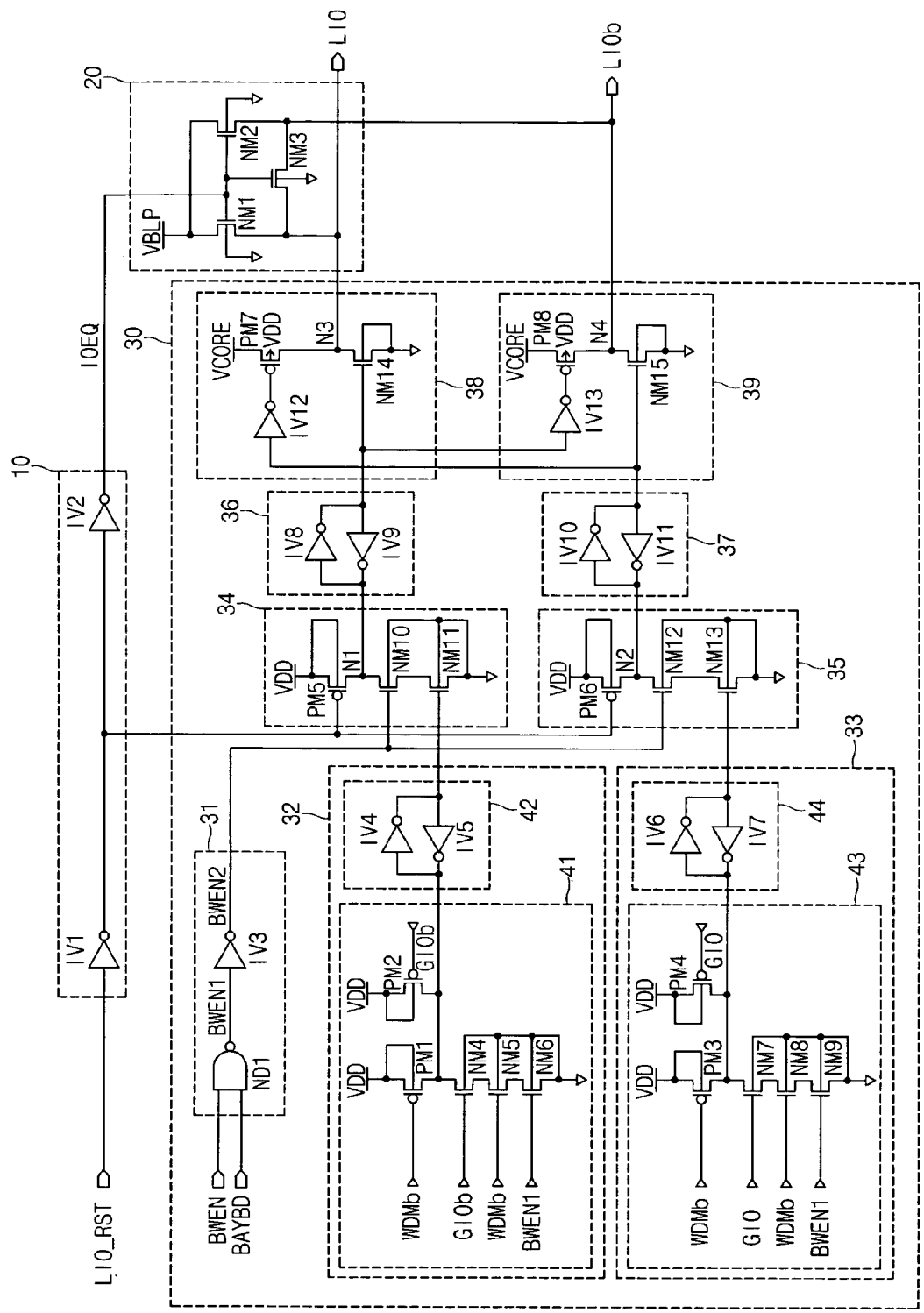
FIG. 1 is a diagram illustrating a local input/output line precharge circuit of a conventional semiconductor memory device.
Figure 2:
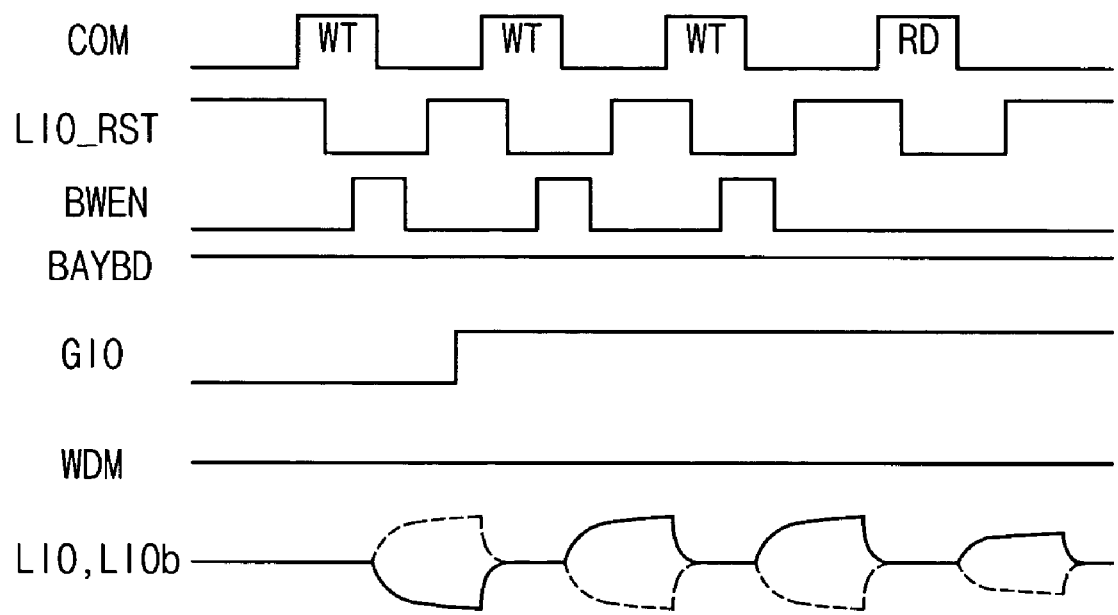
FIG. 2 is a diagram illustrating input/output waveforms of the local input/output line precharge circuit of FIG. 1.
Figure 3:
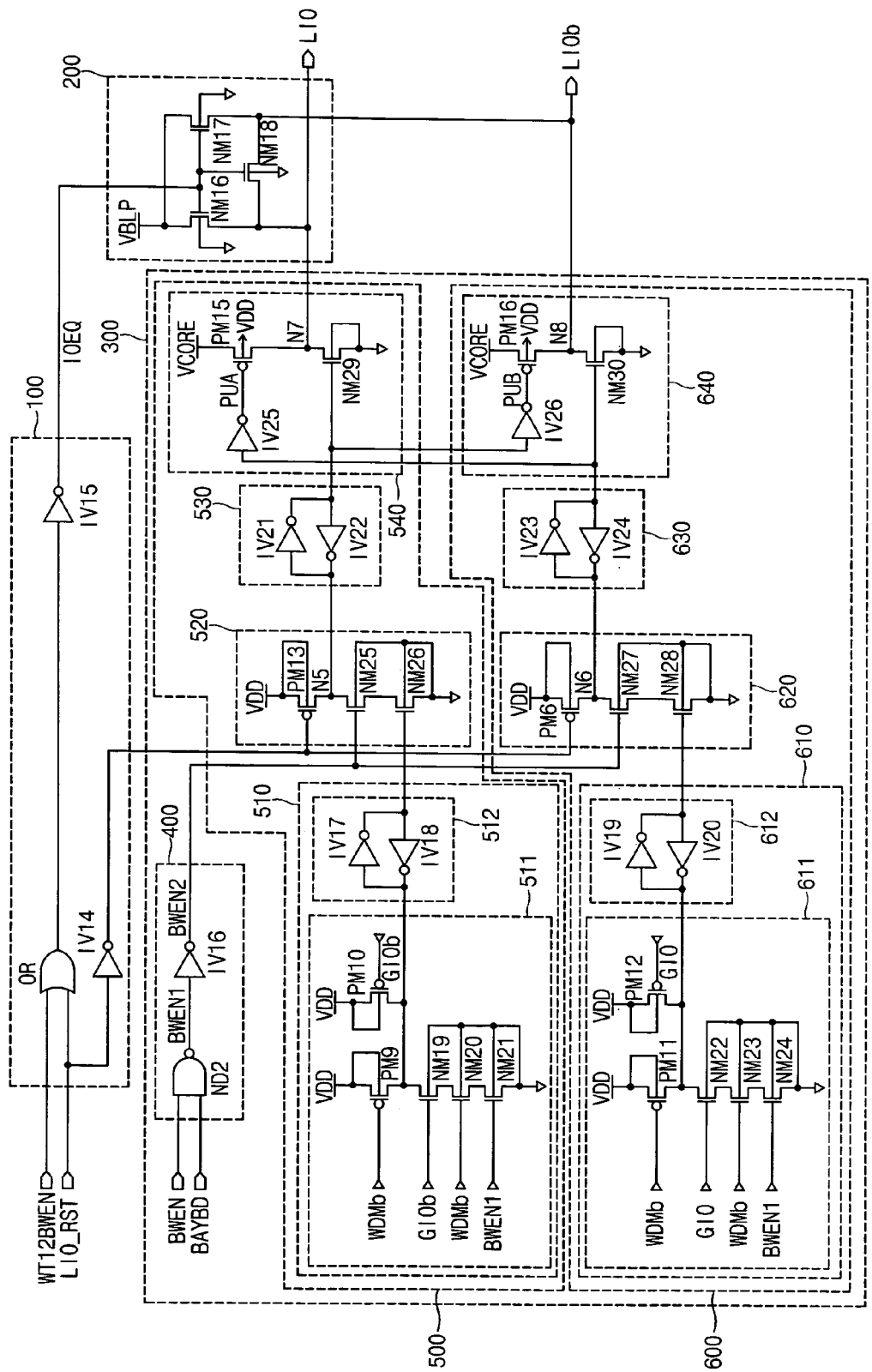
FIG. 3 is a diagram illustrating a local input/output line precharge circuit of a semiconductor memory device according to an embodiment of the present invention.

FIG. 3 is a diagram illustrating a local input/output line precharge circuit of a semiconductor memory device according to an embodiment of the present invention.

In an embodiment, a local input/output line precharge circuit of a semiconductor memory device comprises a precharge control unit 100, an equalization unit 200 and a data output unit 300.

The precharge control unit 100 comprises an OR gate OR, and inverters IV14 and IV15.

The OR gate OR performs an OR operation on a precharge signal LIO_RST and a continuous write signal WR12BWEN. The inverter IV15 inverts an output signal from the OR gate OR to output a precharge control signal IOEQ, and the inverter IV 14 inverts the precharge signal LIO_RST. Here, the precharge signal LIO_RST is enabled to a high level at a precharge mode, and the continuous write signal WR12BWEN is enabled to a high level when a write command is continued.

The equalization unit 200 equalizes a pair of local input/output lines LIO and LIOb in response to the precharge control signal IOEQ. Here, the equalization unit 200 comprises NMOS transistors which are controlled by the precharge control signal IOEQ. The NMOS transistors NM16 and NM17 have drains to receive the precharge voltage VBLP and sources connected to the pair of local input/output lines LIO and LIOb, respectively. The NMOS transistor NM18 has a drain and a source connected to the sources of the NMOS transistors NM16 and NM17 respectively, thereby equalizing the pair of local input/output lines LIO and LIOb.

The data output unit 300 outputs data signals of a pair of global input/output lines GIO and GIOb to the pair of local input/output lines LIO and LIOb at a write mode. Here, the data output unit 300 comprises a write driver control unit 400, a local input/output line output unit 500 and a local input/output line bar output unit 600.

The write driver control unit 400 comprises a NAND gate ND2 and an inverter IV16. The NAND gate ND2 performs a NAND operation on a write driver enable signal BWEN and a write driver stop signal BAYBD. The inverter IV16 inverts an output signal BWEN1 from the NAND gate ND2.

The write driver enable signal BWEN is a signal to drive drivers 520 and 620, and the write driver stop signal BAYBD is a signal to stop the operations of the drivers 520 and 620.

The local input/output line output unit 500 comprises a global input/output line bar output unit 510, a pull-up driver 520, a latch unit 530 and a local input/output line driving unit 540.

The global input/output line bar output unit 510 outputs the data signal of the global input/output line bar GIOb in response to a data masking bar signal WDMb, a global input/output line bar signal GIOb and the output signal BWEN1 from the NAND gate ND2. Here, the global input/output line bar output unit 510 comprises a global input/output line bar driving unit 511 and a latch unit 512. The data masking bar signal WDMb for masking the data signal does not transmit the inputted data of the pair of global input/output lines to the pair of local input/output lines when the data masking bar signal WDMb is enabled to 'high', so that the write operation may not be performed.

The global input/output line bar driving unit 511 comprises PMOS transistors PM9 and PM10 that have drains to receive a power voltage VDD level in response to the data masking bar signal WDMb and the global input/output line bar signal GIOb, and NMOS transistors NM19~NM21 which are controlled by the global input/output line bar signal GIOb, the data masking bar signal WDMb and an output signal BWEN1 from the NAND gate ND2. The PMOS transistor PM9 and the NMOS transistors N19~NM21 are connected serially between a power voltage terminal and a ground voltage terminal. The PMOS transistor PM10 is connected between the power voltage terminal and the drain of the PMOS transistor PM9.

The latch unit 512, which comprises inverters IV17 and IV18 whose output terminals are connected to their input terminals, maintains an output terminal of the global input/output line bar driving unit 511 at a predetermined level.

The pull-up driver 520 comprises a PMOS transistor PM13, NMOS transistors NM25 and NM26 which are connected serially between the power voltage VDD terminal and the ground voltage terminal. Here, the PMOS transistor PM13 applies a power voltage level to a node N5 in response to an output signal from the inverter IV14, and the NMOS transistors NM25 and NM26 are connected serially between the node N5 and the ground voltage terminal. The NMOS transistor NM25 is controlled by an output signal BWEN2 from the inverter IV16, and the NMOS transistor NM26 is controlled by an output signal from the global input/output line bar output unit 510, thereby applying the ground voltage level signal to the node N5.

The latch unit 530 which comprises IV21 and IV22 maintains a potential of the node N5 at a predetermined level. An output terminal of the inverter IV21 is connected to an input terminal of the inverter IV22, and an output terminal of the inverter IV22 is connected to an input terminal of the inverter IV21.

The local input/output line driving unit 540 comprises a PMOS transistor PM15 and a NMOS transistor NM29 which are connected serially between the power voltage terminal and the ground voltage terminal. Here, the inverter IV25 inverts an output signal from the latch unit 630, the PMOS transistor PM15 applies a core voltage VCORE level to a node N7 in response to an output signal PUA from the inverter IV25, and the NMOS transistor N29 applies the ground voltage level to the node N7 in response to an output signal from the latch unit 530.

The local input/output line bar output unit 600 comprises a global input/output line output unit 610, a pull-down driver 620, a latch unit 630 and a local input/output line bar driving unit 640.

The global input/output line output unit 610 outputs the data signal of the global input/output line GIO in response to the data masking bar signal WDMb, the global input/output line signal GIO and the output signal BWEN1 from the NAND gate ND2.

The global input/output line driving unit 611 comprises PMOS transistors PM11 and PM12 that have drains to receive the power voltage VDD level in response to the data masking bar signal WDMb, and the global input/output line signal GIO, and NMOS transistors NM22~NM24 which are controlled by the global input/output line signal GIO, the data masking bar signal WDMb and the output signal BWEN1 from the NAND gate signal ND2. The PMOS transistor PM11 and the NMOS transistors NM22~NM24 are connected serially between the power voltage terminal and the ground voltage, and the PMOS transistor PM12 is connected between the power voltage terminal and the drain of the PMOS transistor PM11.

The latch unit 612, which comprises inverters IV19 and IV20 whose output terminals are connected to their input terminals, maintains an output terminal of the global input/output line driving unit 611 at a predetermined level.

The pull-down driver 620 comprises a PMOS transistor PM14, NMOS transistors NM27 and NM28 which are connected serially between the power voltage VDD terminal and the ground voltage terminal. Here, the PMOS transistor PM14 applies the power voltage level to a node N6 in response the output signal from the inverter IV14, and the NMOS transistors NM27 and NM28 are connected serially between the node N6 and the ground voltage terminal. The NMOS transistor NM27 is controlled by the output signal BWEN2 from the inverter IV16, and the NMOS transistor NM28 is controlled by an output signal from the global input/output line output unit 610.

The latch unit 630 which comprises inverters IV23 and IV24 maintains a potential of the node N6 at a predetermined level. An output terminal of the inverter IV23 is connected to an input terminal of the inverter IV24, and an output terminal of the inverter IV24 is connected to an input terminal of the inverter IV23.

The local input/output line bar driving unit 640 comprises an inverter IV26, a PMOS transistor PM16 and a NMOS transistor NM30. Here, the inverter IV26 inverts an output signal from the latch unit 530, the PMOS transistor PM16 applies the core voltage VCORE level to a node N8 in response to an output signal PUB from the inverter IV26, and the NMOS transistor NM30 applies the ground voltage level to the node N8 in response to an output signal from the latch unit 630.

Figure 4:
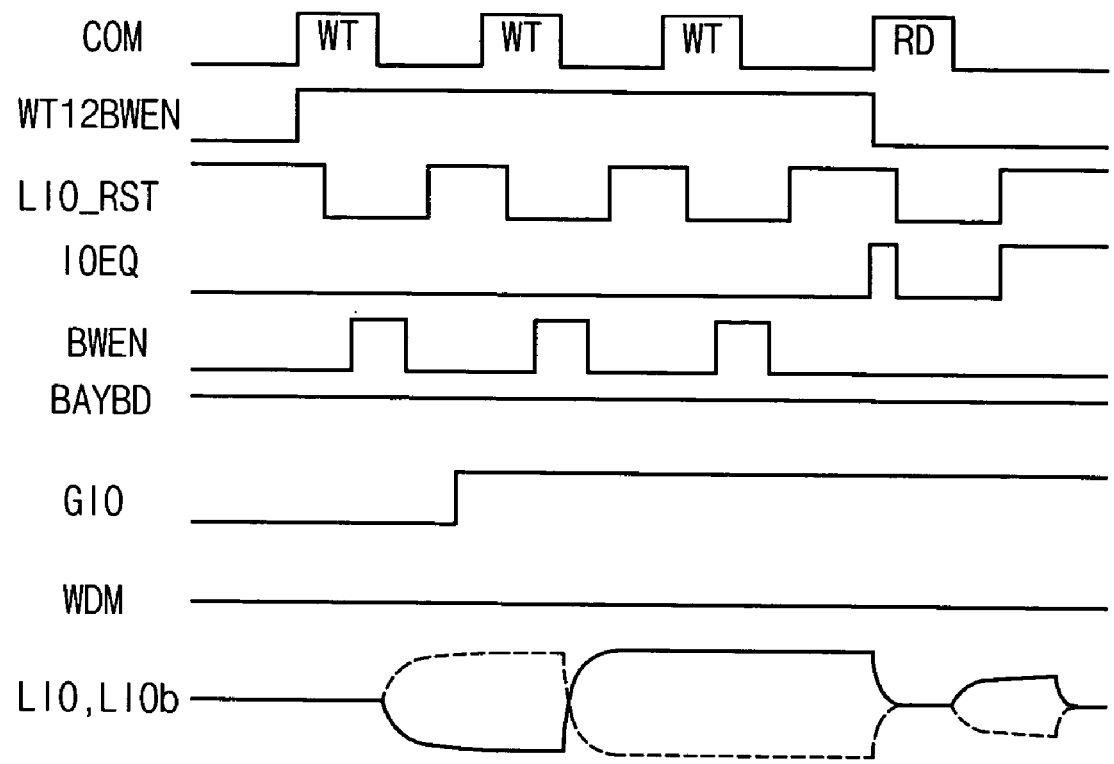
FIG. 4 is a diagram illustrating input/output waveforms of the local input/output line precharge circuit of FIG. 3.

FIG. 4 is a diagram illustrating input/output waveforms of the local input/output line precharge circuit of FIG. 3.

The data output unit 300 outputs the data signals of the pair of the global input/output lines GIO and GIOb to the pair of local input/output lines LIO and LIOb.

As shown in FIG. 4, when a read command RD is applied after a write command WT is applied three times successively, the continuous write signal WT12BWEN is enabled to 'high' while the write operation is performed.

The precharge control unit 100 outputs the precharge control signal IOEQ having a high level for driving the equalization unit 200 only when the continuous write signal WR12BWEN and the precharge signal LIO_RST are all 'low', and the precharge control signal IOEQ having a low level since the continuous write signal WR12BWEN is continuously 'high' at the write mode.

Thereafter, the equalization unit 200 precharges the pair of the local input/output lines LIO and LIOb at a level of the precharge voltage VBLP when the precharge control signal IOEQ is 'high', and outputs a data signal of the data output unit 300 to the pair of local input/output lines LIO and LIOb when the precharge control signal IOEQ is 'low'.

In this way, the local input/output line precharge circuit according to the embodiment of the present invention outputs the precharge control signal IOEQ having the low level at the continuous write mode to perform the write operation without a precharge operation, and outputs the precharge control signal IOEQ having the high level at the read mode to perform the precharge operation.

The above precharge operation can be performed due to a sufficient driving capacity for changing the pair of local input/output lines at a desired level even when a write driver (not shown) does not precharge the pair of local input/output lines.

Accordingly, in a local input/output line precharge circuit according to an embodiment of the present invention, current consumption can be reduced by omitting a precharge operation at a continuous write mode of a semiconductor memory device.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A local input/output line precharge circuit of a semiconductor memory device, comprising:
    a precharge control unit for outputting a precharge control signal to precharge a pair of local input/output lines in response to a continuous write signal, wherein the continuous write signal is activated while at least two write commands are continually applied, and wherein the precharge control signal is not outputted when the continuous write signal is activated;
    an equalization unit for precharging and equalizing the pair of local input/output lines in response to the precharge control signal; and
    a data output unit for outputting data signals of a pair of global input/output lines to the pair of local input/output lines.

2. The local input/output line precharge circuit according to claim 1, wherein the precharge control unit comprises a logic operation unit for performing a logic operation on a precharge signal and the continuous write signal.

3. The local input/output line precharge circuit according to claim 2, further comprising:
    a first inversion unit for inverting an output signal from the logic operation unit; and
    a second inversion unit for inverting the precharge signal.

4. The local input/output line precharge circuit according to claim 2, wherein the logic operation unit is an OR gate.

5. The local input/output line precharge circuit according to claim 2, wherein the equalization unit comprises:
    a first switching device for applying a precharge voltage level to a local input/output line in response to the precharge signal;
    a second switching device for applying a precharge voltage level to a local input/output line bar in response to the precharge signal; and
    a third switching device for equalizing the pair of local input/output lines in response to the precharge signal.

6. The local input/output line precharge circuit according to claim 5, wherein the first through the third switching devices are NMOS transistors.

7. The local input/output line precharge circuit according to claim 1, wherein the data output unit comprises:
    a write driver control unit for combining a write driver enable signal with a write driver stop signal;
    a local input/output line output unit for outputting data of a global input/output line to a local input/output line in response to an output signal from the write driver control unit; and
    a local input/output line bar output unit for outputting data of a global input/output line bar to a local input/output line bar in response to output signal from the write driver control unit.

8. The local input/output line precharge circuit according to claim 7, wherein the write driver control unit comprises:
    a logic operation unit for performing a logic operation on the write driver enable signal and the write driver stop signal; and
    an inversion unit for inverting an output signal from the logic operation unit.

9. The local input/output line precharge circuit according to claim 8, wherein the local input/output line output unit comprises:
    a global input/output line bar output unit for outputting a data signal of the global input/output line bar;
    a pull-up driver driven by an output signal from the global input/output line bar output unit, an output signal from the write driver control unit, and the precharge signal;
    a latch unit for latching an output signal from the pull-up driver; and
    a local input/output line driving unit for driving an output signal from the latch unit.

10. The local input/output line precharge circuit according to claim 8, wherein the local input/output line output unit comprises:
    a global input/output line output unit for outputting a data signal of the global input/output line;
    a pull-down driver driven by an output signal from the global input/output line output unit, an output signal from the write driver control unit, and the precharge signal;
    a latch unit for latching an output signal from the pull-down driver; and
    a local input/output line bar driving unit for driving an output signal from the latch unit.

* * * * *